(12) United States Patent
Bernstein et al.

(10) Patent No.: US 6,670,683 B2
(45) Date of Patent: Dec. 30, 2003

(54) COMPOSITE TRANSISTOR HAVING A SLEW-RATE CONTROL

(75) Inventors: Kerry Bernstein, Underhill, VT (US); Anthony Correale, Jr., Raleigh, NC (US); Terence Blackwell Hook, Jericho, VT (US); Douglas Willard Stout, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 157 days.

(21) Appl. No.: 09/754,156

(22) Filed: Jan. 4, 2001

(65) Prior Publication Data

US 2002/0084497 A1 Jul. 4, 2002

(51) Int. Cl.⁷ .................. H01L 29/76; H01L 27/01; H01L 29/94; H01L 31/062; H01L 31/113
(52) U.S. Cl. .................. 257/392; 257/347; 257/391; 257/404; 257/401; 257/364
(58) Field of Search ................. 257/401, 391, 257/392, 404, 412, 413, 364, 368, 347

(56) References Cited

U.S. PATENT DOCUMENTS

| 4,567,378 A | 1/1986 | Raver |
| 4,779,013 A | 10/1988 | Tanaka |
| 4,890,187 A | 12/1989 | Tailliet et al. |
| 4,894,791 A | 1/1990 | Jiang et al. |
| 4,987,324 A | 1/1991 | Wong et al. |
| 5,146,306 A | 9/1992 | Ferry et al. |
| 5,343,051 A | * 8/1994 | Yamaguchi et al. ........ 257/347 |
| 5,416,352 A | * 5/1995 | Takada ........................ 257/364 |
| 5,510,641 A | 4/1996 | Yee et al. |
| 5,703,496 A | 12/1997 | Sabin |
| 5,859,554 A | 1/1999 | Higashisaka et al. |
| 5,995,440 A | 11/1999 | Lewis et al. |

FOREIGN PATENT DOCUMENTS

JP          60-7179     *  1/1985    .................. 257/392

OTHER PUBLICATIONS

Jasmin et al., "Feedback Loop SCSI Driver With a Controlled Slew Rate", IBM Technical Disclosure Bulletin, vol. 38, No. 9, Sep. 1995, pp. 171–175.

* cited by examiner

Primary Examiner—Steven Loke
(74) Attorney, Agent, or Firm—Richard A. Henkler; Bracewell & Patterson, L.L.P.

(57) ABSTRACT

A metal oxide semiconductor transistor having a slew-rate control is disclosed. The transistor having a slew-rate control includes an elongated diffusion area and an elongated gate overlying the diffusion area. The elongated diffusion area has at least two diffusion regions, each having a threshold voltage that is different from each other. The elongated gate has a gate contact at only one side of the elongated diffusion area.

7 Claims, 4 Drawing Sheets

COMPOSITE TRANSISTOR HAVING A SLEW-RATE CONTROL

BACKGROUND OF THE INVENTION

1. Technical Field

The present invention relates to semiconductor devices in general, and in particular to metal oxide semiconductor (MOS) transistors. Still more particularly, the present invention relates to a MOS transistor having a slew-rate control.

2. Description of the Prior Art

Integrated circuit devices commonly employ output buffers for driving other external devices. In order to provide a high DC drive capability, at least two output transistors are typically placed in parallel within each output buffer of an integrated circuit device. When an output buffer is changing states, the switching current present within the output buffer becomes a major source of noise spikes on power buses, which may induce latch-up to other devices. Although such noise spikes can be lessened by reducing the size of output buffers, small output buffers are usually incapable of driving heavy loads that are frequently required of an output buffer. Hence, a slew rate control circuit is commonly provided to slow down an output buffer in a manner that will reduce the rate of change of output voltage and peak current value while maintaining the DC drive capability of the output buffer. Slew rate is defined as the rate of output transition in volts per unit time. Slew rate control is also very important in the settings of precision differential amplifier applications and delay line applications in which precision delay signals are introduced to a signal propagation.

Conventionally, a slew rate control circuit for an output buffer includes multiple delay elements placed between each pair of parallel output transistors within the output buffer. However, the inclusion of delay elements requires considerable amount of silicon area in which the output buffer is implemented. The area penalty becomes more costly as the output area becomes a size limiting factor for circuits that are manufactured in submicron technology. Consequently, it would be desirable to provide an improved apparatus for controlling the slew rate of an output buffer such that the above-described problems associated with the prior art slew rate control circuit can be alleviated.

SUMMARY OF THE INVENTION

In accordance with a preferred embodiment of the present invention, a transistor having a slew-rate control includes an elongated diffusion area and an elongated gate overlying the diffusion area. The elongated diffusion area has at least two diffusion regions, each having a threshold voltage that is different from each other. The elongated gate has a gate contact at only one side of the elongated diffusion area.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein:

FIG. 2b is a graphical depiction of the output voltage characteristic of the output transistor from FIG. 2a;

FIG. 3b is a graphical depiction of the output voltage characteristic of the output transistor from FIG. 3a;

FIG. 4b is a graphical depiction of the output voltage characteristic of the output transistor from FIG. 4a.

DETAILED DESCRIPTION OF A PREFERRED EMBODIMENT

Figure 1:
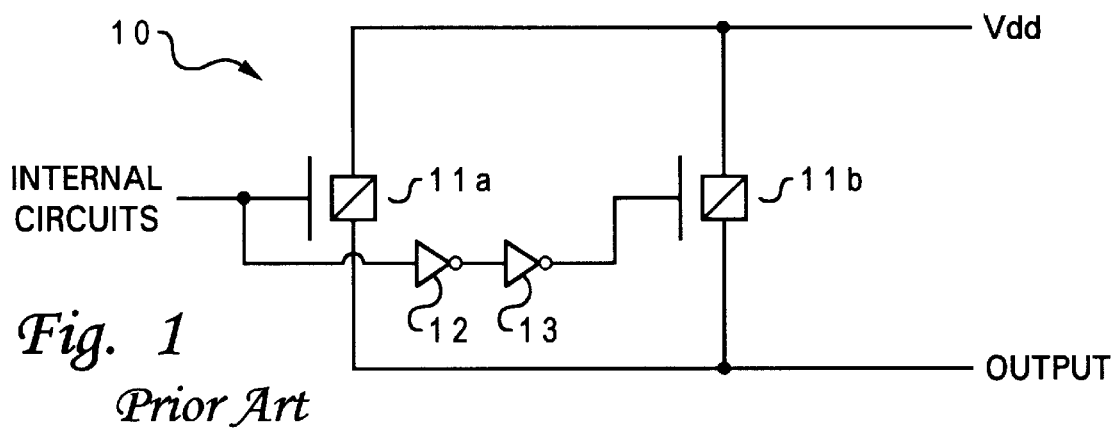
FIG. 1 is a circuit diagram of an output buffer according to the prior art.

Referring now to the drawings and in particular to FIG. 1, there is depicted a circuit diagram of an output buffer according to the prior art. As shown, an output buffer 10 includes an output transistor 11a and an output transistor 11b connected in parallel. In order to control the slew rate of output buffer 10, several delay elements, such as inverters 12 and 13, are placed between output transistors 11a and 11b. Because of the addition of inverters 12 and 13, the silicon area required to implement output buffer 10 is larger than is necessary.

Thus, instead of using two output transistors connected in parallel to implement an output buffer, the present invention employs one output transistor with a built-in slew-rate control. There are two scenarios that should be considered. The first scenario relates to situations when the slew rate of a rising input signal is critical and must be controlled. The second scenario relates to situations when the slew rate of the falling edge of an input signal is critical and must be controlled. The first scenario is handled by an output transistor shown in FIG. 2a, and the second scenario is handled by an output transistor shown in FIG. 3a.

Figure 2A:
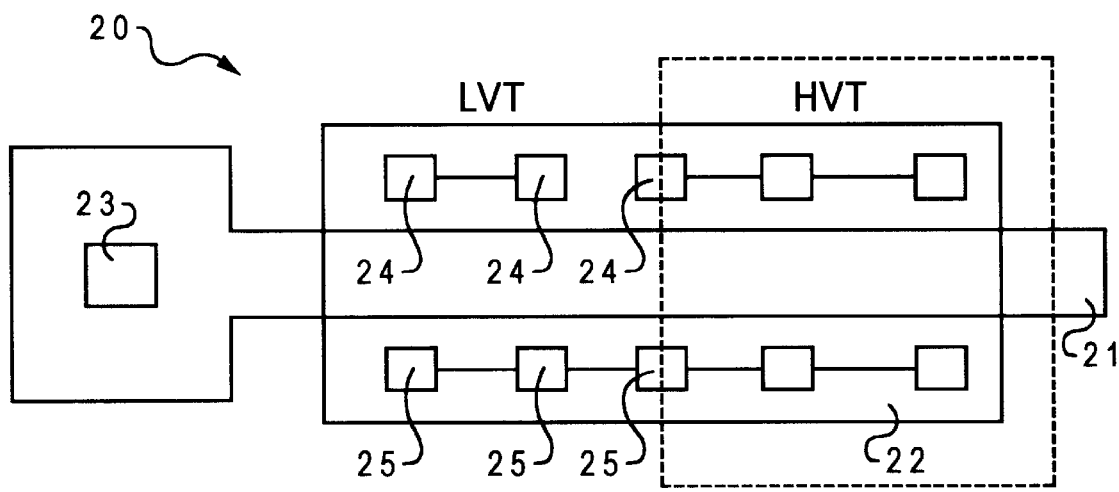
FIG. 2a is a circuit layout diagram of an output transistor, in accordance with a preferred embodiment of the present invention.

With reference now to FIG. 2a, there is illustrated a circuit layout diagram of an output transistor having a slew-rate control, in accordance with a preferred embodiment of the present invention. As shown, an P-channel output transistor 20 includes an elongated polysilicon gate 21 and an elongated diffusion 22. Polysilicon gate 21 is connected to other circuits via a gate contact 23. The source and drain of diffusion 22 are connected to other circuits via diffusion contacts 24, 25, respectively. Output transistor 20 is a "wide" device with a relatively short channel length. The aspect ratio of width-to-length for diffusion 22 is approximately 10:1. As a comparison, for a given integrated circuit device with multiple transistors including output transistor 20 that are manufactured by the 0.25 $\mu$m complementary-metal-oxide semiconductor (CMOS) technology, output transistor 20 has a channel width of approximately 2.25 $\mu$m and a channel length of approximately 0.15 $\mu$m, while other transistors have an average channel width of approximately 0.75 $\mu$m and an average channel length of approximately 0.15 $\mu$m.

Output transistor 20 has preferably two different threshold voltage (Vt) regions, namely, a low Vt (LVT) region and a high Vt (HVT) region, within diffusion 22 for achieving slew rate control. In FIG. 2a, the LVT region is located closer to gate contact 23 than the HVT region. The slew rate control of output transistor 20 is achieved by the percentage of gate width allocated to the LVT region and the HVT region.

Polysilicon gate 21 is also wide and narrow. Thus, a conducting channel will slowly form from the left side of diffusion 22 to the right side of diffusion 22 because of the delay for a voltage signal to travel across the resistance of polysilicon gate 21. The resistance of polysilicon gate 21 can be further increased by adding squares of resistance between the LVT and HVT regions, and/or altering the doping of polysilicon gate 21. The resistance of polysilicon gate 21 may also be controlled by selectively blocking the silicide formation in various regions of polysilicon gate 21. In addition, although the channel length of polysilicon gate 21 is shown to be uniform in FIG. 2a, it is understood the channel length of polysilicon gate 21 can be longer in the LVT region than in the HVT region or vice versa such that shorter portion would appear as a "bottleneck" to the longer portion.

Figure 2B:
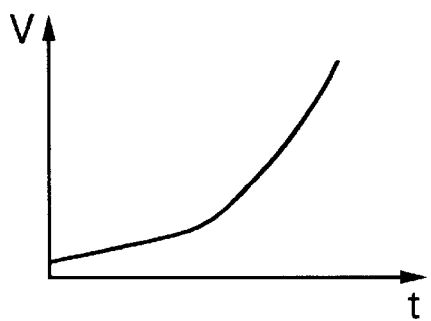

The output voltage characteristic of output transistor 20 is depicted in FIG. 2b. As shown, the output voltage of output transistor 20 ramps up slowly in the beginning when only the LVT region of diffusion 22 is turned on. The LVT region is turned on before the HVT region because the LVT region is closer to gate contact 23 than the HVT region, and the LVT region has a lower voltage threshold than the HVT region. Afterwards, the output voltage of output transistor 20 begins to increase at a faster ramp rate when the LVT and HVT regions are both turned on. In essence, the LVT region produces a slow initial ramp and then the HVT region produces a faster ramp to complete the transition of a signal. The time delay for turning on the HVT region of output transistor 20 can be controlled by adjusting the resistance of polysilicon gate 21.

Figure 3A:
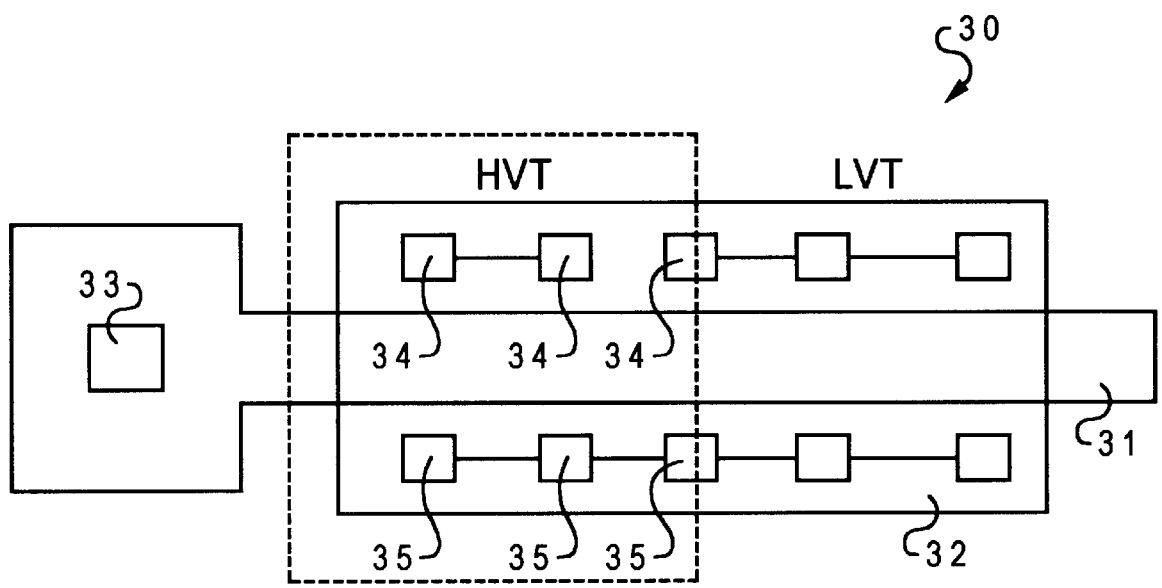
FIG. 3a is a circuit layout diagram of an output transistor, in accordance with a second embodiment of the present invention.

Referring now to FIG. 3a, there is illustrated a circuit layout diagram of an output transistor, in accordance with a second embodiment of the present invention. As shown, a P-channel output transistor 30 includes an elongated polysilicon gate 31 and an elongated diffusion 32. Polysilicon gate 31 is connected to other circuits via a gate contact 33. The source and drain of diffusion 32 are connected to other circuits via diffusion contacts 34, 35, respectively. The difference between output transistor 30 and output transistor 20 (from FIG. 2) is that the HVT region of output transistor 30 is located closer to gate contact 33 than the HVT region of output transistor 20. As a result, output transistor 30 has an output voltage characteristic that is different from that of output transistor 20.

Figure 3B:
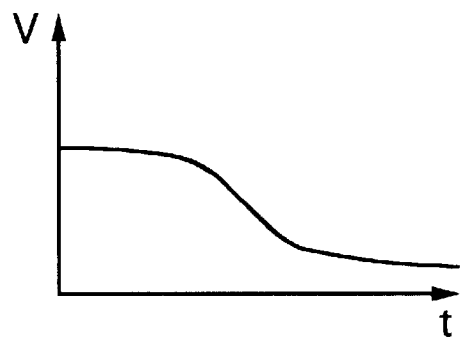

The output voltage characteristic of transistor 30 is depicted in FIG. 3b. As shown, the output voltage of output transistor 30 ramps down slowly in the beginning when only the HVT region is turned off. Afterwards, the output voltage of output transistor 30 begins to ramp down rapidly when the HVT and LVT regions are both turned off. The HVT region is located closer to gate contact 23 and is smaller than the LVT region so output transistor 30 initially discharges the load slowly. The LVT region turns on subsequently and sinks current more quickly to achieve the completion of the transition. The time delay for turning on the LVT region of output transistor 30 can be controlled by adjusting the resistance of polysilicon gate 31.

Figure 4A:
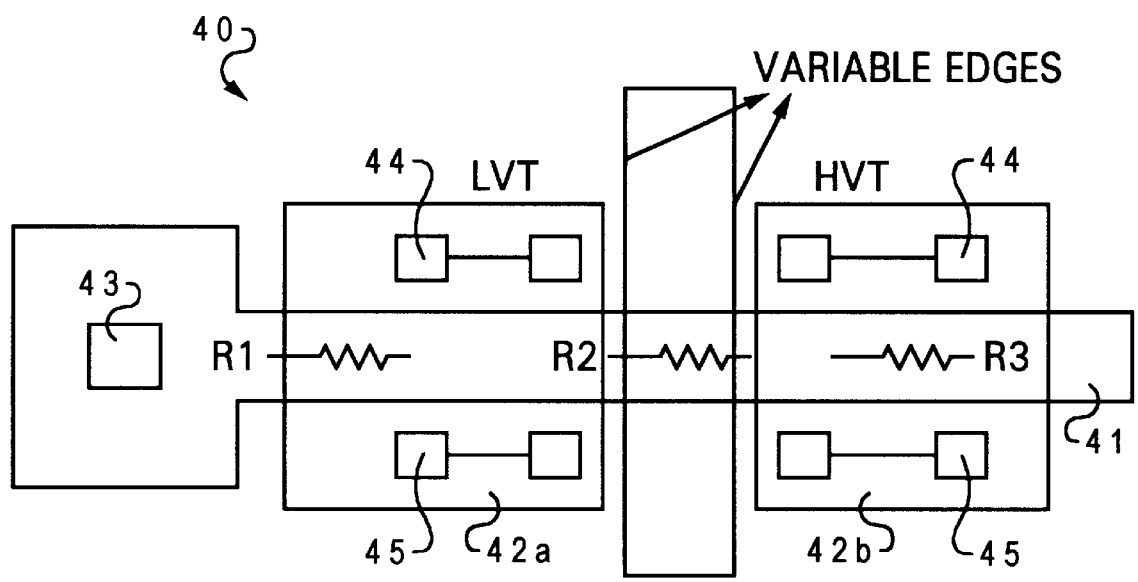
FIG. 4a is a circuit layout diagram of an output transistor, in accordance with a third embodiment of the present invention.

With reference now to FIG. 4a, there is illustrated a circuit layout diagram of an output transistor having a slew-rate control, in accordance with a third embodiment of the present invention. As shown, a P-channel output transistor 40 includes an elongated polysilicon gate 41 and diffusions 42a, 42b. Diffusion 42a is the LVT region, and diffusion 42b is the HVT region. Polysilicon gate 41 is connected to other circuits via a gate contact 43. The source and drain of diffusions 42a, 42b are connected to other circuits via diffusion contacts 44, 55, respectively. The resistance of the middle segment of polysilicon gate 41 is R2, and the resistance of the remaining two segments of polysilicon gate 41 are R1 and R3, where R2>R1>R3.

Figure 4B:
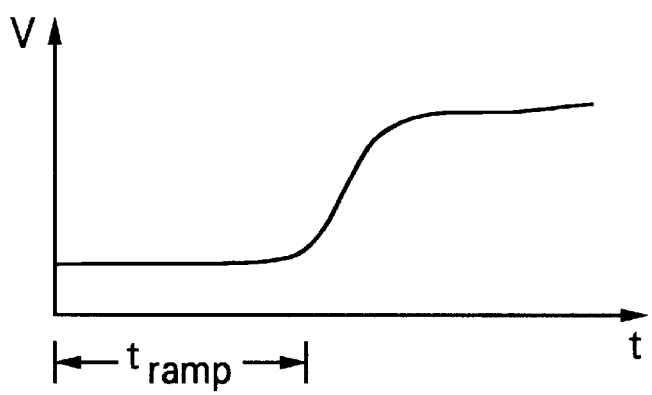

The output voltage characteristic of output transistor 40 is depicted in FIG. 4b. Similar to FIG. 3b, the output voltage of output transistor 40 ramps up slowly initially when only the HVT region is turned on. Afterwards, the output voltage of output transistor 40 begins to ramp up rapidly when the HVT and LVT regions are both turned on. The difference between FIG. 4b and FIG. 3b is that the initial ramp up time, $t_{ramp}$, in FIG. 4b is longer than that of FIG. 3b.

Figure 5:
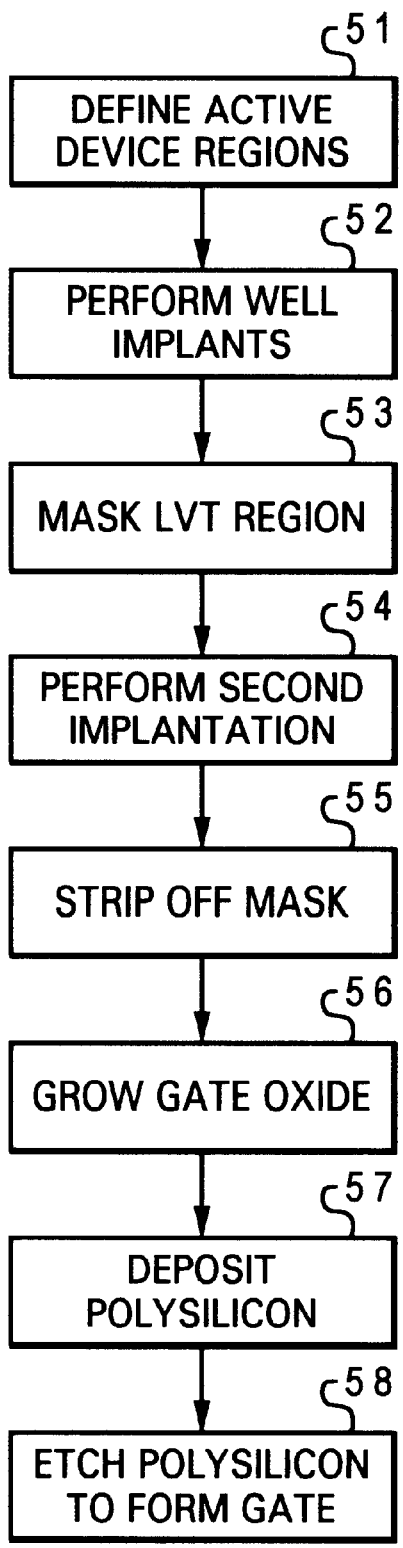
FIG. 5 is a high-level process flow diagram of a method for manufacturing the transistor from FIG. 2a, in accordance with a preferred embodiment of the present invention.

Referring now to FIG. 5, there is illustrated a high-level process flow diagram of a method for manufacturing a transistor having a slew-rate control, such as output transistor 20 from FIG. 2a, in accordance with a preferred embodiment of the present invention. After all active device regions have been isolated by silicon dioxide, as shown in block 51, an ion implantation procedure is performed to define a well area, as depicted in block 52. The ion implantation procedure can be performed by using N-type ions, such as Phosphorus, with a dose in the range of $1 \times 10^{12}$ atoms/cm$^2$ to $5 \times 10^{12}$ atoms/cm$^2$ and an energy of 15–50 KeV. After masking off an intended LVT region in the well area, as shown in block 53, another ion implantation procedure is performed to define an HVT region in the well area, as depicted in block 54. Such ion implantation procedure can be performed by using N-type ions with a dose in the range of $5 \times 10^{12}$ atoms/cm$^2$ to $10 \times 10^{12}$ atoms/cm$^2$ and an energy of 15–50 KeV. After stripping off the mask from the well area, as shown in block 55, a gate oxide is grown over the well area, as depicted in block 56. The thickness of the gate oxide is preferably 2 nm–5 nm. Next, a layer of polysilicon, approximately 150 nm–200 nm, is deposited over the gate oxide, as shown in block 57. Finally, a gate is formed by etching the polysilicon, as depicted in block 58.

As has been described, the present invention provides an output transistor having a slew-rate control. The output transistor of the present invention allows customized slew rate control on precision circuits to achieve specific functional responses. Such type of control is often required in order to sense signals, to customize arrays, or to produce delay lines accurately. Although P-channel transistors are used to illustrate the present invention, it is understood by those skilled in the art that the principle of the present invention can also be applicable to N-channel transistors using P-type dopants such as Boron.

While the invention has been particularly shown and described with reference to a preferred embodiment, it will be understood by those skilled in the art that various changes in form and detail may be made therein without departing from the spirit and scope of the invention.

What is claimed is:

1. A transistor comprising:
    a gate contact;
    an elongated diffusion area having at least two diffusion regions, wherein said elongated diffusion area includes at least one long side and at least one short side, wherein one of said at least two diffusion regions has a higher impurity dosage than the other and is located closer to said gate contact; and
    an elongated gate overlying said elongated diffusion area, wherein said elongated gate having said gate contact located adjacent to said at least one short side of said elongated diffusion area.

2. The transistor of claim 1, wherein an axis along an elongated width of said elongated gate lies in parallel with an axis along an elongated width of said elongated diffusion area.

3. The transistor of claim 1, wherein said at least two diffusion regions located adjacent to each other along an axis of an elongated width of said elongated diffusion area.

4. A transistor comprising:

an isolation region;

at least two diffusion regions each having an impurity dosage different from one another, and being separated by said isolation region; and an elongated gate overlying said at least two diffusion regions and said isolation region, wherein said gate has a gate contact at only one side of one of said at least two diffusion regions.

5. The transistor of claim 4, wherein one of said at least two diffusion regions has a lower impurity dosage than the other and is located closer to said gate contact.

6. The transistor of claim 4, wherein said elongated gate has a different resistance in each of said at least two diffusion regions.

7. The transistor of claim 4, wherein said elongated gate has a first length in one of said at least two diffusion regions, and a second length in the other one of said at least two diffusion regions.

* * * * *